(12) United States Patent  (10) Patent No.: US 7,757,394 B2
Watanabe  (45) Date of Patent: Jul. 20, 2010

(54) MULTILAYER WIRING BOARD

(75) Inventor: Yoshio Watanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 503 days.

(21) Appl. No.: 11/212,684

(22) Filed: Aug. 29, 2005

(65) Prior Publication Data

US 2006/0049130 A1 Mar. 9, 2006

(30) Foreign Application Priority Data

Aug. 31, 2004 (JP) .......................... P2004-253593

(51) Int. Cl.
    *H01K 3/10* (2006.01)
(52) U.S. Cl. .............................. 29/852; 29/835; 29/846; 174/250; 174/254
(58) Field of Classification Search .................. 29/852, 29/832, 835, 846, 848; 174/250, 254; 216/13, 216/17; 257/685, 686
    See application file for complete search history.

(56) References Cited

U.S. PATENT DOCUMENTS 3,873,889 A * 3/1975 Leyba ........................ 361/728
6,699,730 B2 * 3/2004 Kim et al. ................... 438/107
7,230,328 B2 * 6/2007 Hazeyama et al. .......... 257/685

FOREIGN PATENT DOCUMENTS

| JP | 02-239695   | 9/1990  |
| JP | 02-284496   | 11/1990 |
| JP | 2000-353863 | 12/2000 |
| JP | 2001-144206 | 5/2001  |
| JP | 2002-171069 | 6/2002  |
| JP | 2002-335077 | 11/2002 |
| JP | 2003-008209 | 1/2003  |
| JP | 2003-318545 | 11/2003 |
| JP | 2003-338687 | 11/2003 |
| JP | 2004-128418 | 4/2004  |

* cited by examiner

*Primary Examiner*—Thiem Phan
(74) *Attorney, Agent, or Firm*—Finnegan, Henderson, Farabow, Garrett and Dunner, L.L.P.

(57) ABSTRACT

A multilayer wiring board having a plurality of wiring layers is proposed, which is prepared by a process having the steps of: forming, on one insulating sheet, wiring patterns for all the wiring layers, which patterns are arranged at predetermined positions; and folding the insulating sheet having formed the wiring patterns in the predetermined order and stacking the folded sheet while positioning, and then heating the resultant sheet in a vacuum under a pressure to form a three-dimensional electric wiring.

6 Claims, 9 Drawing Sheets

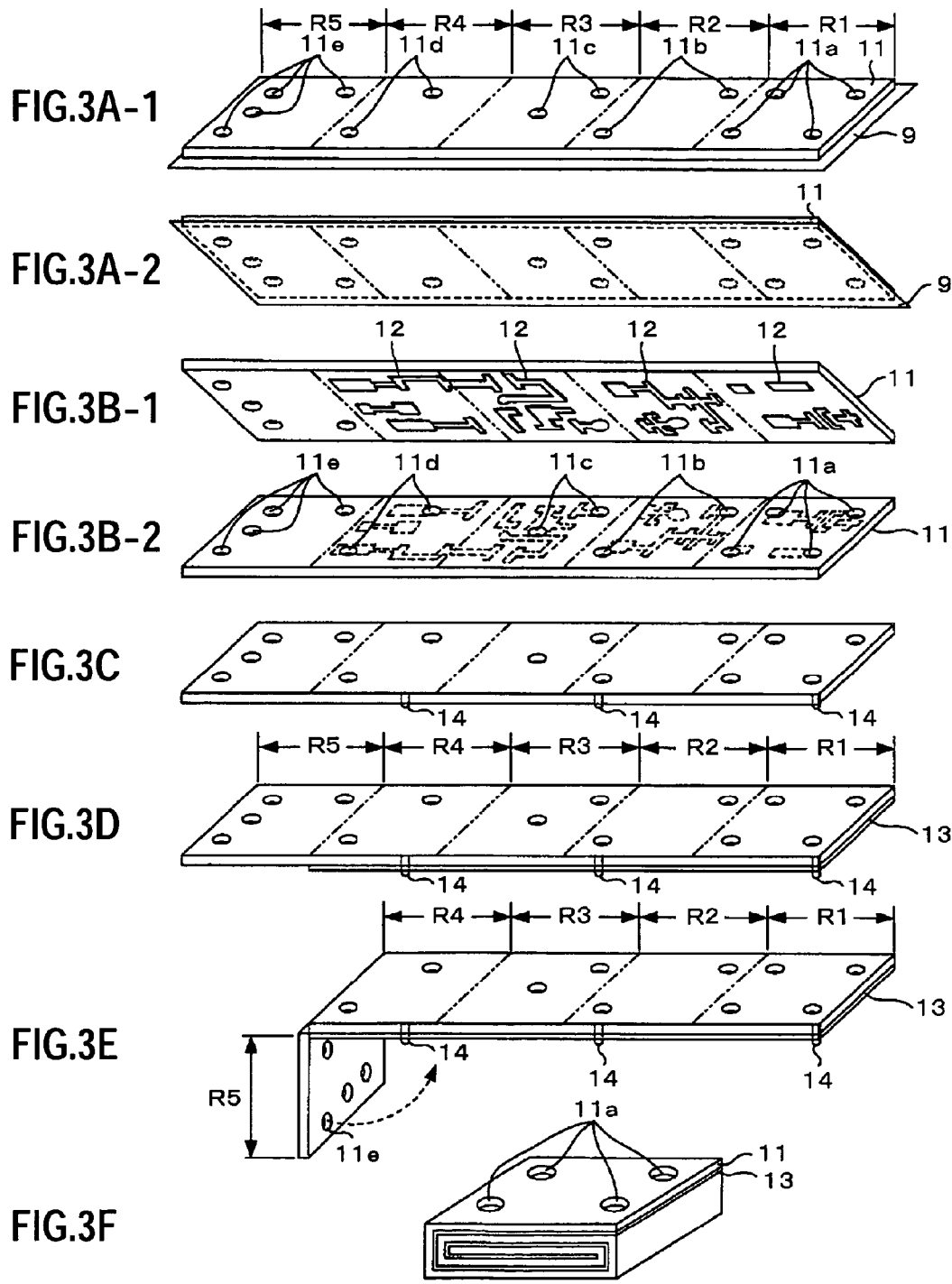

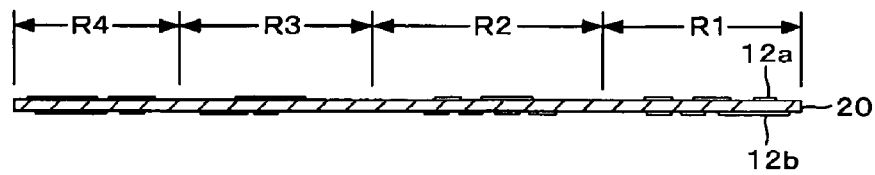
FIG.5A
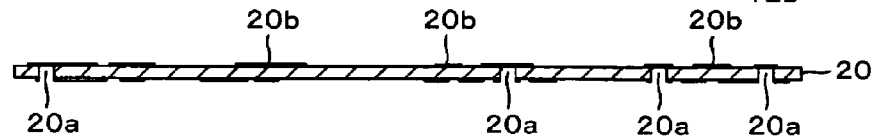
FIG.5B
FIG.5C
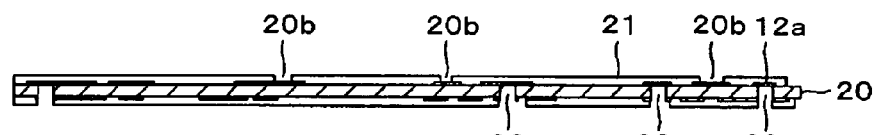
FIG.5D
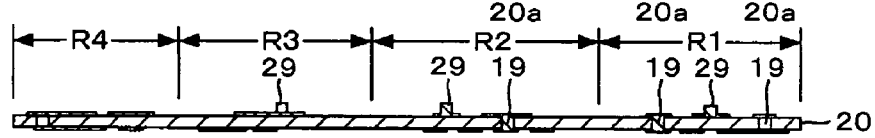
FIG.5E
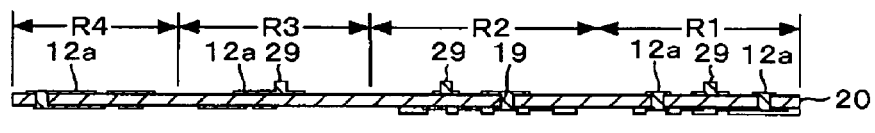
FIG.5F
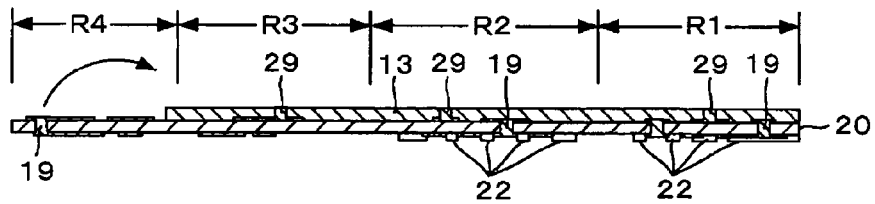
FIG.5G
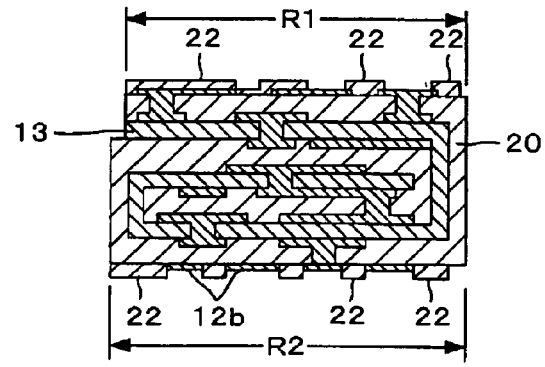

MULTILAYER WIRING BOARD

CROSS REFERENCE TO RELATED DOCUMENT

This application claims priority to Japanese Patent Application No. 2004-253593, filed on Aug. 31, 2004.

BACKGROUND OF THE INVENTION

1. Field of the Invention

The present invention relates to a multilayer wiring board which is suitable for the production of products of a number of types in respectively small amounts in a short term by the so-called build-to-order production in which the production is started after receiving an order, and a process for fabricating a multilayer wiring board.

2. Description of Related Art

An example of a fabrication process for a conventional, general multilayer printed wiring board is described with reference to FIG. 9.

A multilayer printed wiring board is fabricated as follows. Using a double-sided copper-clad laminate comprising a resin base material which is comprised of an epoxy resin containing, e.g., about 500-mm square glass cloth, and which has both surfaces laminated with a copper foil (S1), a pattern for inner layer of the wiring board is first formed by a so-called photolithography method (S1 to S7). The copper-clad laminate is covered with a dry film (photoresist)(S2), and, using a photomask having formed a pattern of the inner layer wiring, the resultant copper-clad laminate is subjected to exposure (S3), development (S4), etching (S5), removal of the dry film (S6), washing with water (S7), and drying (S8).

Then, a copper foil is stacked on each of the top and back surfaces of the patterned inner layer substrate through a thermosetting resin (prepreg) (S9), and heated under a pressure to bond them together (S10). A pattern of the outer layer is formed through steps (S11 to S17) in the same manner as in the formation of the inner layer pattern (S2 to S8). Subsequently, a via hole is formed in the patterned outer layer (step 18), and the inside of the via hole is cleaned, followed by copper plating for the via hole for achieving electrical connection between the inner wiring and the outer layer (step 19).

Next, for surely obtaining the reliability including a moisture resistance, the wiring board laminate is subjected to post-treatment. Specifically, a solder resist pattern is formed on each of the top and back surfaces of the wiring board laminate having formed the pattern of the outer layer wiring (step 20) to cover substantially the whole area, excluding connection terminal areas, such as lands and pads. Then, the number for the board, letters and characters, and the like are printed by silk screening (step 21). The resultant wiring board is processed into a predetermined external dimension, and, for the multiple dividable board, if necessary, a V-groove or the like is formed so that the board can be easily divided in the subsequent step (step 22). Subsequently, checking, such as an appearance test or a conduction test, is conducted (step 23), and the land and pad, which are exposed through the solder resist pattern, are subjected to surface treatment, e.g., plating or anticorrosion treatment (step 24), thus completing a multilayer printed wiring board.

With respect to the multilayer printed wiring board, for surface mount parts, such as IC parts and chip parts in the QFP (quad flat package), a solder paste is printed (step 25), and then parts are mounted (S26), and subjected to reflow heating and soldered at a predetermined position (step 27). Particularly, when the part to be mounted is sensitive to high-frequency waves or the like, a shielding case for electromagnetic shielding is fixed to a region containing the part and soldered to achieve electrical conduction between the case and the ground (step 28).

When the wiring pattern is comprised of four layers including the top and back surfaces, for example, one double-sided copper-clad laminate is used for the inner layer and two copper foils are used for the outer layers of the top and back surfaces, and treatments of exposure, development, etching, and removal of the resist are conducted using four photomasks for the respective layers. When the wiring pattern is comprised of six layers, for example, one double-sided copper-clad laminate is used for the inner layer and two laminates are used for the outer layer and patterns are formed using six photomasks for the respective layers.

As examples of the conventionally known printed wiring boards, there can be mentioned those disclosed in patent document 1 and patent document 2.

[Patent document 1] Japanese Patent Application Publication No. 2002-335077 (FIG. 3)

[Patent document 2] Japanese Patent Application Publication No. 2000-353863 (FIG. 4)

SUMMARY OF THE INVENTION

The fabrication process for a conventional multilayer printed wiring board is advantageously used in the mass production; however, a photomask is needed per layer in the exposure, and a pattern is formed per layer, and hence a prolonged preparation time is required, and there is a difference in yield between the layers formed, causing the amount of materials used to be large.

Specifically, a pattern is formed per layer and therefore, when the same apparatus is used, a production lead time is remarkably prolonged and, on the other hand, when parallel production is made, a plurality of apparatuses must be used, so that large space and investment for the production are required. Further, the yields of formation of the patterns in the respective layers are likely to be different from one another, and therefore the amount of materials used is determined from the amount needed in the step having the lowest yield, so that materials in a large amount are inevitably used.

On a printed wiring board comprising the thus fabricated multilayer printed wiring board are mounted electronic parts, and particularly a portion constituting a high-frequency circuit is covered with a metallic case or the like for electromagnetic shielding, and thus the mounting region of the wiring board occupied by the electronic parts needs a large area, so that the size of the printed wiring board itself must be increased. In this case, the case for electromagnetic shielding is placed on the printed wiring board and connected to the ground, and therefore there occurs disadvantages not only in that an additional operation of soldering is required, but also in that the case may be removed due to the vibration which the wiring board receives.

For obtaining a construction equivalent to the multilayer printed wiring board, there is a method in which electronic parts are mounted on a flexible substrate comprised of a thin base material having formed wiring patterns, and a portion of the flexible substrate positioned outside of the mounting region for electronic parts is bent and stacked on and connected to a portion of the flexible substrate formed on other electronic parts. In this case, however, the conduction between the upper and lower flexible substrates stacked is achieved only through the stacked portions at the both ends of the flexible substrates, and therefore there is a problem in that a noise is generated or absorbed at any intermediate portion in the long wiring, causing the substrate to be sensitive to the electromagnetic interaction between the parts.

In view of the above problems, in the present invention, there is proposed a multilayer wiring board which is advantageous not only in that it is suitable for the production of products of a number of types in respectively small amounts, but also in that a construction having electromagnetic shielding for electronic parts can be easily achieved, and a process for fabricating a multilayer wiring board.

For solving the above problems, the multilayer wiring board of the present invention is a multilayer wiring board having a plurality of wiring layers, which is obtained by forming, on one insulating sheet, wiring patterns for all the wiring layers, which patterns are arranged at predetermined positions, and folding the insulating sheet having formed the wiring patterns in the predetermined order and stacking the folded sheet while positioning, and then heating the resultant sheet in a vacuum under a pressure to form a three-dimensional electric wiring.

By virtue of having the above construction, in the multilayer wiring board of the present invention, when the inequality: (Number of the insulating layers)×(Area per layer in the multilayer wiring board)<(Work size) is satisfied, wiring patterns for all the layers can be formed on a single insulating sheet at the same time, and therefore not only can the length of time required for forming the wiring patterns be remarkably shortened, but also only one apparatus is needed in the respective processing.

The present invention is the above multilayer wiring board, wherein a hole is formed in the insulating sheet so that the conductor surface of the wiring patterns is exposed through the hole to form a protrusion comprised of the conductor on the surface on which the wiring patterns are formed, and an insulating bonding layer is formed so that the top portion of the protrusion is not completely buried in the bonding layer, wherein the conductor surface exposed through the hole and the protrusion are electrically connected to each other after folding and stacking the insulating sheet.

By virtue of having the above construction, in the multilayer wiring board of the present invention, the bonding layer constitutes an insulating layer between the wiring patterns, and further the wiring pattern exposed through the hole formed in the insulating sheet and the protrusion are bonded under a pressure, thus achieving interlayer electrical connection with high reliability.

The present invention is the above multilayer wiring board, wherein substantially whole the outermost surface is covered with a cured insulating resin.

By virtue of having the above construction, in the multilayer wiring board of the present invention, an electronic part can be mounted on the copper foil surface of the multilayer wiring board exposed through the hole, or the multilayer wiring board can be mounted on another printed wiring board of a larger size, and, since the outer surface is covered with a cured insulating resin, a disadvantage in that the wiring patterns suffer corrosion due to moisture penetration or the like can be considerably avoided without forming a solder resist on the surface in a separate step.

The present invention is the above multilayer wiring board, wherein an electronic part is formed on the wiring patterns, wherein the electronic part is positioned at the inner layer after folding and stacking the insulating sheet.

By virtue of having the above construction, in the multilayer wiring board of the present invention, a structure in which the electronic part is embedded in the insulating resin is formed, and therefore the initial performance and contact reliability can be maintained for a long term.

The present invention is the above multilayer wiring board, wherein the electronic part is a resistor or a capacitor formed by calcination of a desired paste.

By virtue of having the above construction, in the multilayer wiring board of the present invention, printing of a solder paste, mounting of an electronic part, or a reflow heating treatment is not required, and the electronic part can be formed in a step similar to the step for forming the wiring patterns, and thus the obtained electronic part-incorporated multilayer wiring board has excellent contact reliability.

The present invention is the above multilayer wiring board, wherein the insulating sheet is folded so that an electromagnetic shielding layer comprised of the wiring pattern is arranged outside of the electronic part.

By virtue of having the above construction, in the multilayer wiring board of the present invention, by folding and stacking the insulating sheet, the electronic part is mounted at the inner layer in the printed wiring board, and therefore the wiring pattern surrounding the electronic part readily serves as an electromagnetic shielding layer, so that not only can the effect of the electromagnetic interaction be lowered, but also there is no need to change the thickness or size of the multilayer wiring board itself and the reliability is not lowered due to vibration.

The process for fabricating a multilayer wiring board of the present invention is a process for fabricating a multilayer wiring board having a plurality of wiring layers, wherein the process comprises the steps of: forming, on one insulating sheet, wiring patterns for all the wiring layers, which patterns are arranged at predetermined positions; forming, in the insulating sheet, a contact hole connected to the wiring patterns; folding the insulating sheet in the predetermined order and stacking the folded sheet while positioning; and heating the folded and stacked insulating sheet in a vacuum under a pressure to form a three-dimensional electric wiring through the contact hole.

By virtue of having the above construction, in the process for fabricating a multilayer wiring board of the present invention, wiring patterns for all the layers can be formed on a single insulating sheet at the same time, and therefore not only can the length of time required for forming the wiring patterns be remarkably shortened, making the process suitable for the production of products of a number of types in respectively small amounts, but also only one apparatus is needed in the respective processing, making it possible to reduce the cost for apparatus.

By the multilayer wiring board and the process for fabricating a multilayer wiring board of the present invention, the length of time required for forming the wiring patterns can be remarkably shortened, and further the interlayer electrical connection with high reliability can be secured, and, in the multilayer wiring board containing an electronic part, an electromagnetic shielding structure which nullifies the effect of the electromagnetic interaction between the inside and the outside can be easily achieved, enabling a process suitable for the production of products of a number of types in respectively small amounts with a short lead time, and furthermore, only one apparatus is needed in the respective processing, thus making it possible to reduce the cost for apparatus.

Further features of the invention, and the advantages offered thereby, are explained in detail hereinafter, in reference to specific embodiments of the invention illustrated in the accompanying drawings.

BRIEF DESCRIPTION OF THE DRAWINGS

FIGS. 2A to 2F are cross-sectional views for explaining the fabrication procedure for the example of the multilayer wiring board according to one embodiment of the present invention, wherein FIG. 2A shows the state in which contact holes are formed in the photosensitive polyimide on a copper foil, FIG. 2B shows the state in which wiring patterns are formed, FIG. 2C shows the state in which bumps are formed, FIG. 2D shows the state in which an insulating bonding layer is formed, FIG. 2E shows the state in which the end portion is bent, and FIG. 2F shows the state in which the wiring board is folded into a wound structure and cured;

FIGS. 3A-1 to 3F are perspective views corresponding to FIGS. 2A to 2F;

FIGS. 4A to 4C are illustrating the procedure for producing a number of the multilayer wiring boards of FIG. 1A to 1B at the same time, wherein FIG. 4A shows patterns in the photosensitive polyimide on a copper foil, FIG. 4B is a top view of the folded state, and FIG. 4C is a front view of FIG. 4B;

FIGS. 5A to 5G are cross-sectional views for explaining the fabrication procedure for another example of the multilayer wiring board according to one embodiment of the present invention, wherein FIG. 5A shows the state in which wiring patterns are formed on the both surfaces of a double-sided copper-clad flexible substrate, FIG. 5B shows the state in which vias are formed, FIG. 5C shows the state in which a plating resist is formed, FIG. 5D shows the state in which bumps are formed, FIG. 5E shows the state in which a solder resist is formed, FIG. 5F shows the state in which an insulating bonding layer is formed, and FIG. 5G shows the state in which the wiring board is folded into a wound structure and cured;

FIGS. 6A to 6E are cross-sectional views for explaining the fabrication procedure for still another example of the multilayer wiring board according to one embodiment of the present invention, wherein FIG. 6A shows the state in which holes are formed in a thermoplastic plastic film, FIG. 6B shows the state in which the holes are plugged, FIG. 6C shows the state in which wiring patterns are formed, FIG. 6D shows the state in which the board is being folded, and FIG. 6E shows the state in which the wiring board is folded into a wound structure and cured;

FIGS. 7A to 7F are cross-sectional views for explaining the fabrication procedure for still another example of the multilayer wiring board according to one embodiment of the present invention, wherein FIG. 7A shows the state in which wiring patterns electrically connected between the both sides of a double-sided copper-clad flexible substrate are formed, FIG. 7B shows the state in which a solder resist pattern is formed, FIG. 7C shows the state in which bumps are formed and an insulating bonding layer is formed, FIG. 7D shows the state in which parts are mounted, and FIG. 7E shows the state in which the wiring board is folded and cured;

FIGS. 8A to 8G are cross-sectional views for explaining the fabrication procedure for still another example of the multilayer wiring board according to one embodiment of the present invention, wherein FIG. 8A shows the state in which wiring patterns are formed on a copper sheet, FIG. 8B shows the state in which a thick film device is formed, FIG. 8C shows the state in which a polyimide film having contact holes is formed, FIG. 8D shows the state in which the surface is covered with a masking film, FIG. 8E shows the state in which bumps are formed and an insulating bonding layer is formed, FIG. 8F shows the state in which the end portion is bent, and FIG. 8G shows the state in which the wiring board is folded into a wound structure and cured.

DESCRIPTION OF THE PREFERRED EMBODIMENTS

Hereinbelow, an example of the best mode for carrying out the multilayer wiring board and the process for fabricating a multilayer wiring board of the present invention will be described with reference to FIGS. 1A to 4C.

Figure 1A:
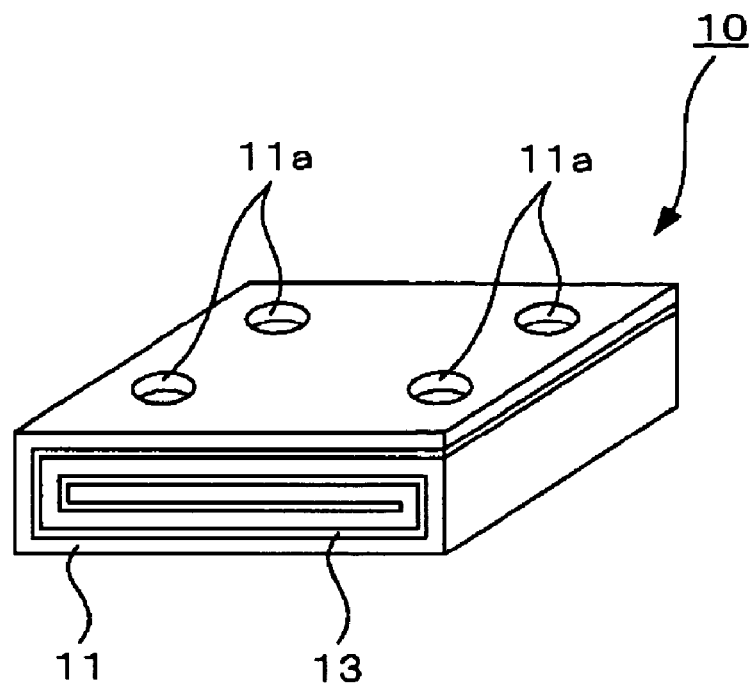
FIG. 1A is a perspective view of appearance.
Figure 1B:
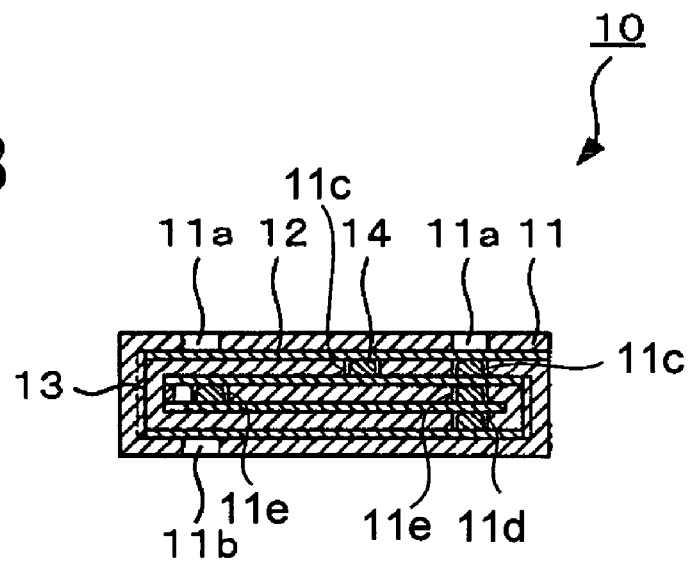
FIG. 1B is a transverse sectional view of an example of a multilayer wiring board according to one embodiment of the present invention.
Figure 2A:
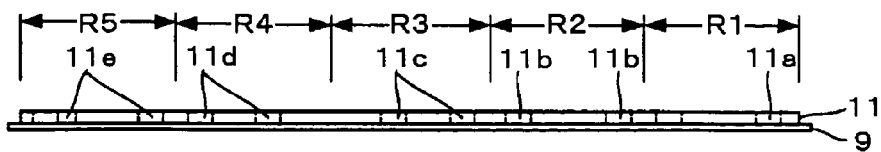
Figure 2B:
Figure 2C:
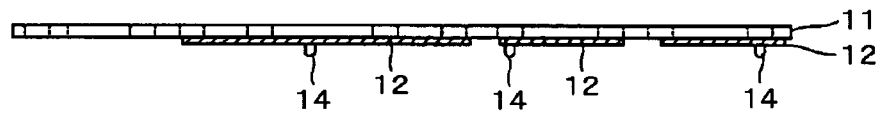
Figure 2D:
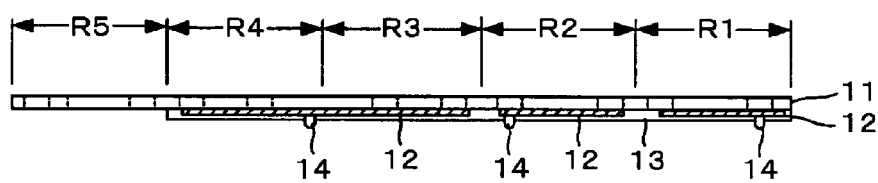
Figure 2E:
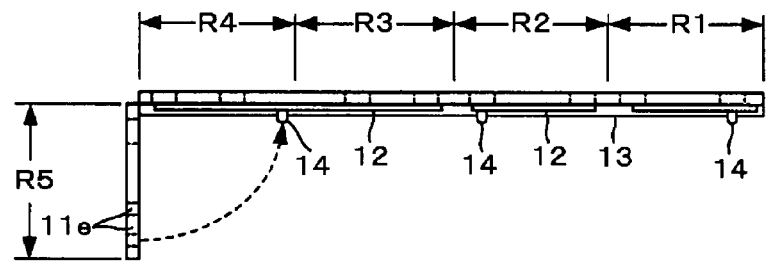
Figure 2F:
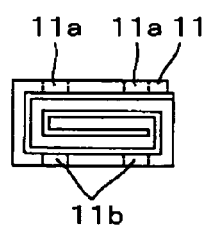
Figure 4A:
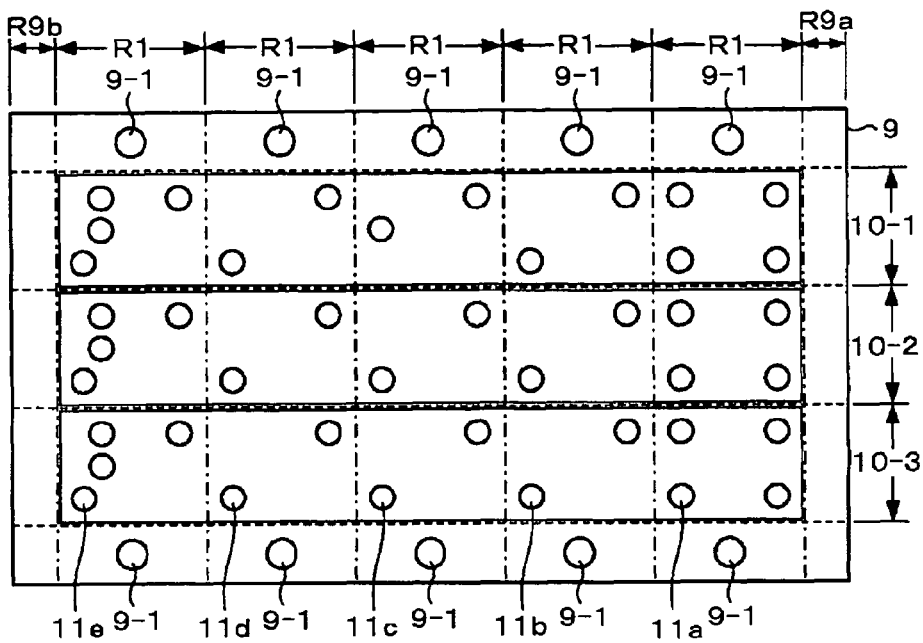
Figure 4B:
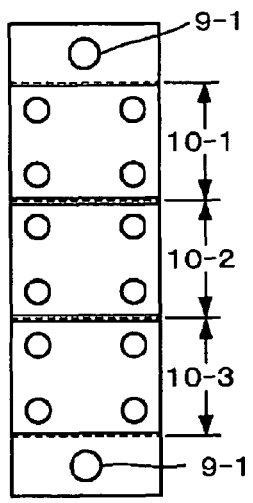
Figure 4C:
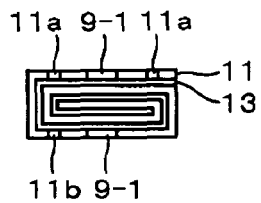

FIGS. 1A and 1B show a multilayer wiring board in the present example, wherein FIG. 1A is a perspective view, and FIG. 1B is a transverse sectional view. FIGS. 2A to 2F are cross-sectional views for explaining the fabrication procedure for the multilayer wiring board in the present example, wherein FIG. 2A shows the state in which contact holes are formed in the photosensitive polyimide on a copper foil, FIG. 2B shows the state in which wiring patterns are formed, FIG. 2C shows the state in which bumps are formed, FIG. 2D shows the state in which an insulating bonding layer is formed, FIG. 2E shows the state in which the end portion is bent, and FIG. 2F shows the multilayer wiring board which is folded into a wound structure and cured. FIGS. 3A to 3F are perspective views corresponding to FIGS. 2A to 2F, wherein the perspective views of FIG. 3A-1 and FIG. 3A-2 correspond to the cross-sectional view of FIG. 2A, and the perspective views of FIG. 3B-1 and FIG. 3B-2 correspond to the cross-sectional view of FIG. 2B. FIGS. 4A to 4C explain the procedure for producing a number of the multilayer wiring boards of FIGS. 1A and 1B at the same time, wherein FIG. 4A shows patterns in the photosensitive polyimide on a copper foil, FIG. 4B is a top view of the folded state, and FIG. 4C is a front view of FIG. 4B.

In FIGS. 1A and 1B, reference numeral 10 designates a multilayer wiring board, and the multilayer wiring board 10 has a size such that, for example, the width is 25 mm, the length is 20 mm, and the thickness is about 0.5 mm, and comprises a wiring pattern layer comprised of four layers. Reference numeral 11 designates a polyimide sheet formed by curing photosensitive polyimide in a sheet form, 12 designates a wiring pattern comprised of a copper foil, 13 designates an insulating bonding layer, 11a designates a contact hole formed in the polyimide sheet 11, and 14 designates a bump (protrusion) comprised of a conductor.

The multilayer wiring board 10 has, as shown in FIG. 1A, a structure comprising a polyimide sheet 11 having formed therein holes 11a, 11a, ..., and an insulating bonding layer, which are wound together so that the polyimide sheet constitutes the outermost layer, and, as shown in FIG. 1B, bumps 14 penetrate holes 11c, 11d, 11e in the polyimide sheet 11 positioned at the inner layer to achieve contact with the wiring pattern in another layer, thus forming a three-dimensional circuit.

The fabrication procedure for the multilayer wiring board 10 in the present example shown in FIGS. 1A and 1B is described below with reference to FIGS. 2A to 4C.

First, as shown in FIG. 2A and FIG. 3A-1, photosensitive polyimide is applied onto a copper foil 9 and dried, and subjected to exposure using a photomask for forming the contact holes 11a, 11b, 11c, 11d and through hole 11e, and developed to form patterns of the contact holes 11a, 11b, 11c, 11d and through hole 11e in a predetermined arrangement, followed by curing by heating in this state, to form the polyimide sheet 11 in a sheet form.

The sheet formed from the photosensitive polyimide cured has no photosensitivity any more and therefore, hereinafter, the sheet is referred to simply as "polyimide sheet 11".

In this instance, as shown in FIG. 2A and FIG. 3A-1, in regions R1 to R5 assumed by dividing the polyimide sheet 11 into five regions, four contact holes 11a are assigned to the region R1, two contact holes 11b to the region R2, two contact holes 11c to the region R3, two contact holes 11d to the region R4, and four holes 11e to the region R5. The upper surface of the copper foil 9 is exposed through the formed contact holes 11a, 11b, 11c, 11d and hole 11e as shown in FIG. 3A-1.

Next, a photosensitive resist is applied to the surface of the copper foil 9 shown in FIG. 2A and the perspective view of FIG. 3A-2 as viewed in the direction from the side of the copper foil 9, and then subjected to exposure using one photomask having formed therein wiring patterns 12 for all the layers (four layers in the present example), followed by development, etching, and removal of the resist, to transfer the wiring patterns 12 comprised of the copper foil 9 to the back surface of the polyimide sheet 11 as shown in FIG. 2B and FIG. 3B-1 (hereinafter, the wiring pattern comprised of a conductor formed by etching the copper foil 9 is designated by reference numeral 12).

In this instance, with respect to the regions R1 to R5 shown in FIG. 3B-1, on the back surface of the polyimide sheet 11, the first layer of the wiring patterns 12 is formed in the region R1, the fourth layer in the region R2, the second layer in the region R3, and the third layer in the region R4, and the copper foil 9 in the region R5 is completely removed by etching to form the through hole 11e. Check for circuit comprised of the wiring patterns 12 is conducted in this stage if necessary. FIG. 3B-2 shows the substrate having formed the wiring patterns 12 as viewed in the direction from the side of the polyimide sheet 11.

Then, as shown in FIG. 2C and FIG. 3C, bumps (protrusions) 14, 14, ... comprised of a conductive paste are formed by a printing method or the like on the surface on which the wiring patterns 12 are formed. The conductive paste comprises an epoxy resin or the like containing silver particles, which is curable at a relatively low temperature, and which forms a cured product having excellent low resistance properties and excellent flexing resistance as well as excellent adhesion.

Next, as shown in FIG. 2D and FIG. 3D, an insulating bonding material is applied so as to cover the regions R1 through R4 on the surface, on which the wiring patterns 12 are formed, in such a thickness that the bumps 14 are not completely buried in the bonding material but the top portions of the bumps 14 protrude from the surface to form an insulating bonding layer 13, and the bonding layer is cured until it has no tackiness. The bonding material used comprises an epoxy resin base containing a slight amount of an additive for improving the adhesion to the polyimide resin and metal.

Then, as shown in FIG. 2E and FIG. 3E, a portion corresponding to the region R5 in which the through holes 11e are formed is bent so that the back surface is in close contact with the surface, on which the wiring patterns 12 are formed, corresponding to the region R4, and, subsequently, the border between the region R4 and the region R3, the border between the region R3 and the region R2, and the border between the region R2 and the region R1 are successively bent in this order, thus forming a multilayer wound structure comprised of the polyimide sheet 11 as a base material shown in FIG. 2F and FIG. 3F (folding step).

In this instance, the bumps formed in the region R4 penetrate the through holes 11e and are connected to the wiring pattern 12 in the region R3, the bumps formed in the region R2 are connected to the copper foil surface exposed through the contact holes 11d in the region R4, and the bumps formed in the region R1 are connected to the copper foil surface exposed through the contact holes 11c in the region R3 (see FIG. 1B). Unnecessary edge faces are removed before folding.

Next, as shown in FIG. 2F and FIG. 3F, the wiring board of a wound structure is placed in a not shown jig, and heated and the surface in which the contact holes 11a are formed is pressed, for example, downward as viewed in the figures while deaerating in a reduced pressure atmosphere to cure the insulating bonding layer 13 in a state in which the layers are in close contact with one another and the conduction is secured and a predetermined thickness is kept, thus forming a multilayer wiring board having a predetermined external dimension.

Finally, the unnecessary resin is removed from the multilayer wiring board cured, and the wiring board is trimmed into the ultimate external shape size to obtain individual pieces. Then, a final test is conducted and, if necessary, the lands comprised of the wiring patterns 12 exposed through the contact holes 11a, 11b formed in the upper and lower surfaces are subjected to gold plating or preflux treatment for corrosion prevention.

Procedure for more efficiently fabricating the multilayer wiring board in the example shown in FIGS. 1A and 1B is described with reference to FIGS. 4A to 4C.

In FIG. 4A, for producing three multilayer wiring boards at the same time using one work-size sheet, three polyimide sheets 11 each having formed the contact holes 11a to 11d and hole 11e shown in FIG. 2A and FIG. 3A are placed lengthwise on the copper foil 9 (three rectangular frames indicated by the solid lines in FIG. 4A).

Specifically, the copper foil 9 having a larger size is prepared, and, as shown in FIG. 4A, for producing a plurality of multilayer wiring boards 10 at the same time, for example, on the upper and lower sides of the copper foil 9, holes 9-1, 9-1, ... for positioning pins in the number corresponding to the number of the required regions R are preliminarily formed (five holes are formed on each of the upper and lower sides in the figure). Then, based on the positioning holes 9-1, 9-1, ..., the required number of oblong wiring patterns 12 are arranged and formed lengthwise (three patterns are formed at 10-1 to 10-3 in the figure).

Then, in accordance with the procedure similar to that described above with reference to FIGS. 2A to 3F, the contact holes 11a, 11b, 11c, 11d and through hole 11e are formed in the three polyimide sheets 11 which are applied in an oblong strip form onto the upper surface of the copper foil 9 and which are arranged lengthwise, and then the copper foil 9 on the back surface is processed to form three wiring patterns 12 arranged lengthwise.

Then, waste substrate regions R9a, R9b shown in FIG. 4A are removed, and then the bumps 14 (see FIG. 2C and FIG. 3C) are formed and the insulating bonding layer 13 comprised of an insulating material is formed (see FIG. 2D and FIG. 3D), and, while successively inserting the positioning holes 9-1, 9-1, ... into two positioning pins formed in a not shown jig for folding, the substrate is wound from the region R5 (see FIG. 2E and FIG. 3E) into the folded state shown in FIG. 4B and FIG. 4C.

Subsequently, the resultant substrate in the state shown in FIG. 4B and FIG. 4C is heated and pressed while deaerating in a reduced pressure atmosphere to cure the resin in a state in which the layers are in close contact with one another, thus securing the interlayer conduction.

Finally, the portions indicated by the broken lines shown in FIG. 4B are cut to separate portions of the upper and lower positioning holes 9-1 and intermediate three portions of multilayer wiring boards, thus producing three multilayer wiring boards.

Before the folding, by forming the conductive junction material disclosed in the published patent application of the present applicant (Unexamined Japanese Patent Application Laid-Open Specification Nos. 2003-8209 and 2003-318545) on the tops of the bumps 14 or the upper surface of the copper foil 9 exposed through the contact holes 11a to 11d, the contact reliability of wiring between the layers after being folded and bonded under pressure can be surely obtained.

In the multilayer wiring board and the process for fabricating a multilayer wiring board in the example shown in FIGS. 1A to 4C, the wiring patterns 12 for all the layers are formed in the copper foil 9 and the polyimide sheet 11 applied to the copper foil 9, and the sheet is folded and heated under a pressure in a reduced pressure atmosphere to electrically connect the wiring patterns 12 in the individual layers to one another, and, when the inequality: (Number of the insulating layers)×(Area per layer in the multilayer wiring board)< (Work size) is satisfied, the wiring patterns for all the layers can be formed on a single insulating sheet at the same time. Therefore, the formation of the wiring patterns 12 can be made in a single step and the multiple division is easy, and hence the multilayer wiring board is suitable for the production of products of a number of types in respectively small amounts in a short term, especially for the production of small-size multilayer printed wiring, and further only one apparatus is needed in the respective processing, thus making it possible to reduce the cost for apparatus.

Another example of the best mode for carrying out the multilayer wiring board and the process for fabricating a multilayer wiring board of the present invention is described with reference to FIGS. 5A to 5G.

FIGS. 5A to 5G are cross-sectional views for explaining the fabrication procedure for the multilayer wiring board in the present example, wherein FIG. 5A shows the state in which wiring patterns are formed on the both surfaces of a double-sided copper-clad flexible substrate, FIG. 5B shows the state in which vias are formed, FIG. 5C shows the state in which a plating resist is formed, FIG. 5D shows the state in which bumps are formed, FIG. 5E shows the state in which a solder resist is formed, FIG. 5F shows the state in which an insulating bonding layer is formed, and FIG. 5G shows the multilayer wiring board which is folded into a wound structure and cured.

In the example shown in FIGS. 1A to 4C, contact holes are formed in the photosensitive polyimide applied to the copper foil 9 and then patterns are formed in the copper foil 9, whereas, in the multilayer wiring board and the process for fabricating a multilayer wiring board in the present example, a double-sided copper-clad sheet comprised of a polyimide resin sheet is used.

In the following descriptions, in FIGS. 5A to 5G and FIGS. 1A to 4C, like parts or portions are indicated by like reference numerals.

First, a photosensitive resist is applied to the copper foil on each of the surfaces of a double-sided copper-clad sheet, and subjected to exposure using two photomasks having formed therein wiring patterns 12 arranged for half of the all layers, followed by treatments of development, etching, and removal of the resist, thus forming, as shown in FIG. 5A, a wiring pattern 12a comprised of a copper foil on the upper surface as viewed in the figure and a wiring pattern 12b on the lower surface shown in FIG. 5A, that is, on the top and back surfaces at the same time.

Then, as shown in FIG. 5B, non-through type vias 20a are formed in the lower surface of the copper-clad sheet shown in FIG. 5B using a laser, and the copper foil surface of the wiring pattern 12a exposed through the bottom of the vias 20a is cleaned, and then a catalyst metal as a nucleus for electroless plating is adsorbed onto the surface, and subsequently the whole of the copper-clad sheet is subjected to electroless copper plating so that the resultant plating film has an extremely small thickness and electroplating for the exposed portion of the polyimide base material 20 can be achieved (the plating layer is not shown). The formation of the closed-end (non-through type) vias using a laser can be achieved by appropriately selecting the specifications of the substrate including the copper foil and the laser conditions.

Next, a plating resist 21 is applied to the entire surface on each side of the polyimide base material 20 and then, as shown in FIG. 5C, the plating resist 21 is patterned to form holes of via 20a-forming portions and bump-forming portions 20b in which bumps are formed later.

Then, the via 20a-forming portions and bump-forming portions 20b exposed through the plating resist 21 (see FIG. 5B) are subjected to copper electroplating in a state in which the electrical conduction is secured by the copper electroless plating to permit plating copper 19 to grow in the vias 20a until the copper has a thickness substantially the same as the thickness of the plating resist 21 simultaneously with forming bumps 29 comprised of plating copper in the bump-forming portions 20b. After the copper electroplating, the resultant substrate is subjected to tin plating, and the plating resist 21 is removed as shown in FIG. 5D, and then the thin electroless plating copper formed on the entire surface of the polyimide base material 20 is removed by etching.

Next, as shown in FIG. 5E, patterns comprised of a solder resist 22 are formed in the region R1 and region R2 which constitute the outermost layer after being folded.

Then, as shown in FIG. 5F, an insulating bonding material 13 is applied to the surface of the polyimide base material 20, which is opposite the surface on which the solder resist 22 is formed, so as to cover the regions R1 through R3 in such a thickness that the bumps are not completely buried in the bonding material but the top portions of the bumps protrude, and cured until it has no tackiness.

Subsequently, the resultant sheet is wound so that the region R4 shown in FIG. 5F constitutes the innermost layer and the surface on which the solder resist 22 is formed (lower surface in the regions R1 and R2 as viewed in FIG. 5F) constitutes the outermost layer (see FIG. 5G).

Finally, as shown in FIG. 5G, the wiring board of a wound structure is placed in a not shown jig, and heated and, for example, the surface of the region R1 is pressed while deaerating in a reduced pressure atmosphere to cure the resin in a state in which the layers are in close contact with one another to secure the interlayer conduction, thus forming a multilayer wiring board.

It is easily understood that the example shown in FIGS. 5A to 5G of the multilayer wiring board and the process for fabricating a multilayer wiring board exhibits effects similar to those achieved by the example shown in FIGS. 1A to 4C.

Still another example of the best mode for carrying out the multilayer wiring board and the process for fabricating a multilayer wiring board of the present invention is described with reference to FIGS. 6A to 6E.

Figure 6A:
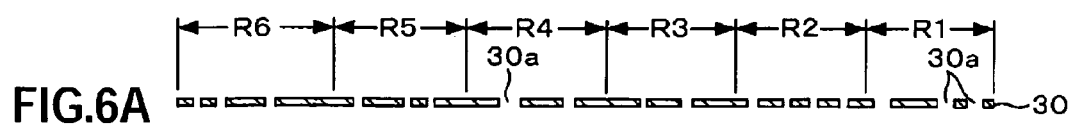
Figure 6B:
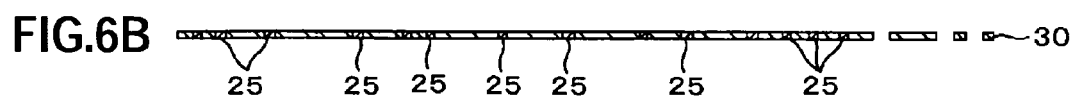
Figure 6C:
Figure 6D:
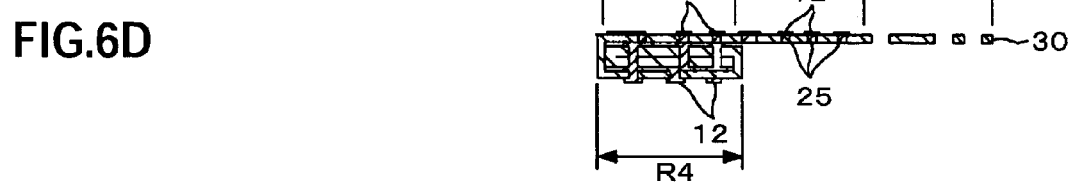
Figure 6E:
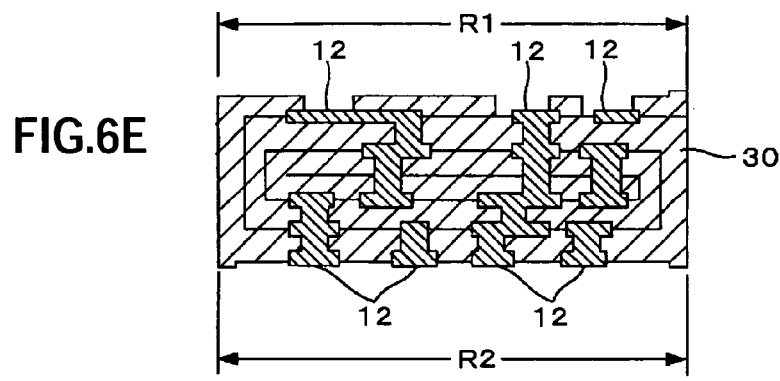

FIGS. 6A to 6E are cross-sectional views for explaining the fabrication procedure for the multilayer wiring board in the present example, wherein FIG. 6A shows the state in which holes are formed in a thermoplastic plastic film, FIG. 6B shows the state in which the holes are plugged, FIG. 6C shows the state in which wiring patterns are formed, FIG. 6D shows the state in which the board is being folded, and FIG. 6E shows the multilayer wiring board which is folded into a wound structure and cured.

In the example shown in FIGS. 5A to 5G, the double-sided copper-clad sheet comprised of a polyimide sheet is used, whereas, in the multilayer wiring board and the process for fabricating a multilayer wiring board in the present example, a so-called liquid crystalline polymer having both thermoplasticity and high heat resistance is used as a base material.

In the following descriptions, in FIGS. 6A to 6E and FIGS. 1A to 5G, like parts or portions are indicated by like reference numerals.

First, as shown in FIG. 6A, openings 30a, 30a, . . . , which are portions corresponding to the contact holes between the both sides of a sheet 30 and the lands on the upper surface after the external shape is completed, are formed in the about 25-µm sheet 30 comprised of a liquid crystalline polymer using a laser or heating pin. As the liquid crystalline polymer, for example, 4-hydroxybenzoic polyester containing isophthalic acid, SPS (syndiotactic polystyrene), or the like can be used.

Then, as shown in FIG. 6B, the opening portions 30a, 30a, . . . are plugged with a conductive paste by a printing method or the like and cured to form plugging pastes 25.

Next, as shown in FIG. 6C, a conductive paste is printed on the upper surface of the sheet 30 as viewed in the figure, and cured to form wiring patterns 12 for all the layers at the same time. Check for circuit comprised of the wiring patterns is conducted in this instance if necessary.

Then, as shown in FIG. 6D, the resultant sheet is wound so that the region R6 constitutes the innermost layer and the upper side of the region R1 and region R2 as viewed in the figure constitutes the outermost layer.

Finally, as shown in FIG. 6E, the wiring board of a wound structure is placed in a not shown jig, and heated to the melting temperature of the liquid crystalline polymer or higher and, for example, the surfaces of the regions R1 and R2 are pressed while deaerating in a reduced pressure atmosphere, and cooled in a state in which the layers are in close contact with one another to cure the resin, thus securing the interlayer conduction. The liquid crystalline polymer has thermoplasticity, and therefore the polymer per se is softened by heating and follows the press plate, thus making the formation of the wiring patterns extremely easy.

If necessary, the resultant sheet is trimmed and connection check is conducted, thus forming a multilayer wiring board.

It is easily understood that the example shown in FIGS. 6A to 6E of the multilayer wiring board and the process for fabricating a multilayer wiring board exhibits effects similar to those achieved by the example shown in FIGS. 1A to 4C.

Still another example of the best mode for carrying out the multilayer wiring board and the process for fabricating a multilayer wiring board of the present invention is described with reference to FIGS. 7A to 7F.

Figure 7A:
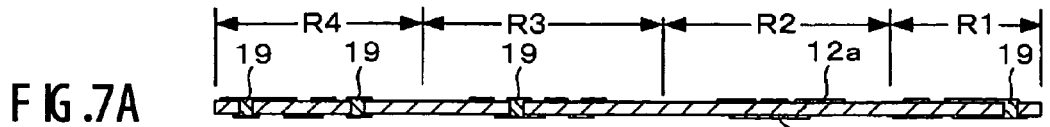
Figure 7B:
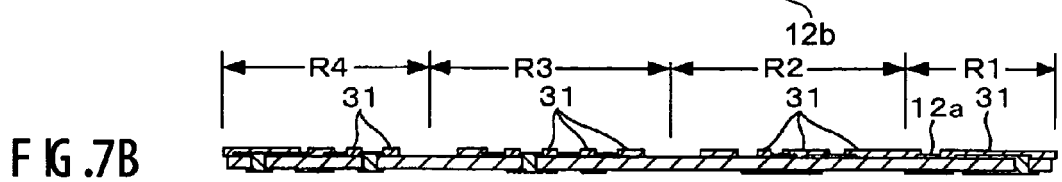
Figure 7C:
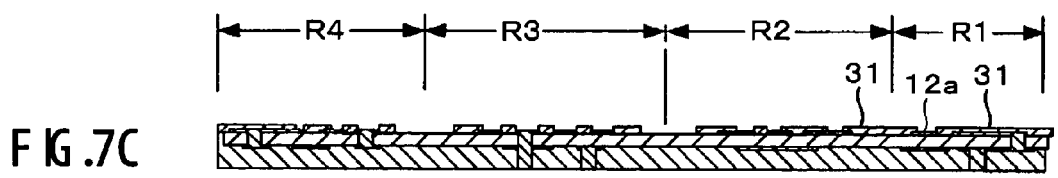
Figure 7D:
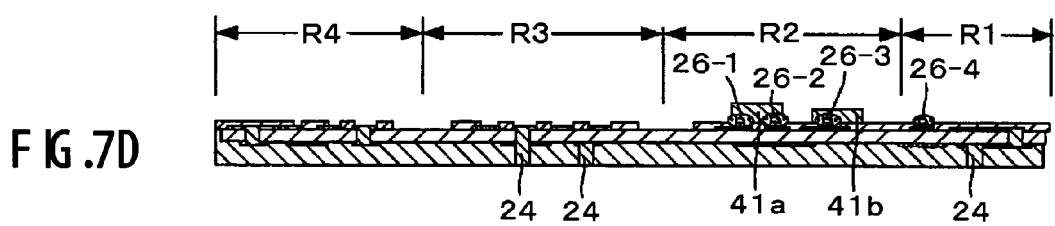
Figure 7E:
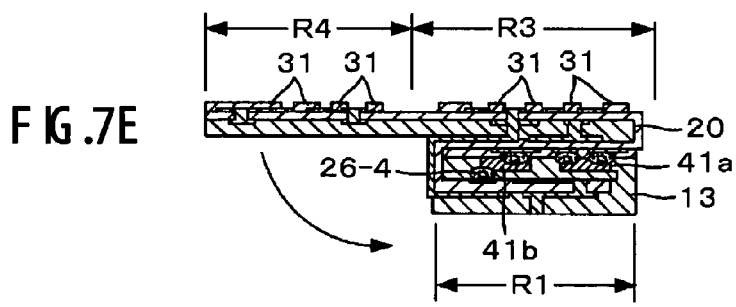

FIGS. 7A to 7F are cross-sectional views for explaining the fabrication procedure for the multilayer wiring board in the present example, wherein FIG. 7A shows the state in which wiring patterns electrically connected between the both sides of a double-sided copper-clad flexible substrate are formed, FIG. 7B shows the state in which a solder resist pattern is formed, FIG. 7C shows the state in which bumps are formed and an insulating bonding layer is formed, FIG. 7D shows the state in which parts are mounted, and FIG. 7E shows the multilayer wiring board which is folded and cured.

In the examples shown in FIGS. 1A to 6E, only wiring patterns are formed in the inner layer, whereas, in the multilayer wiring board and the process for fabricating a multilayer wiring board in the present example, electronic parts are mounted on the wiring patterns in the inner layer. In the following descriptions, in FIGS. 7A to 7F and FIGS. 1A to 6E, like parts or portions are indicated by like reference numerals.

First, contact holes are formed in a double-sided copper-clad sheet having a polyimide base material 20, and then subjected to electroless copper plating and copper electroplating treatment in the same manner as in the example shown in FIGS. 5A to 5G, i.e., FIG. 5C and FIG. 5D to allow plating copper to grow in the contact holes, plugging the holes.

Then, a photosensitive resist is applied to the copper foil on each of the surfaces of the double-sided copper-clad sheet, and subjected to exposure using two photomasks having formed therein wiring patterns 12 arranged for half of the all layers, followed by treatments of development, etching, and removal of the resist, thus forming, as shown in FIG. 7A, a wiring pattern 12a comprised of a copper foil on the upper surface as viewed in the figure and a wiring pattern 12b on the lower surface as viewed in the figure, that is, on the top and back surfaces of the polyimide base material 20 at the same time.

Then, as shown in FIG. 7B, a solder resist pattern is formed using photosensitive polyimide 31 as a solder resist on the upper surface as viewed in the figure.

Next, as shown in FIG. 7C, bumps 24 for connection with other layers after the stacking are formed on the surface which is opposite the surface on which the solder resist pattern is formed (i.e., on the lower surface as viewed in the figure), and then an insulating bonding layer 13 is formed. The bumps 24 can be formed using the above-mentioned conductive paste (see FIG. 2C and FIG. 3C) or copper electroplating (see FIGS. 5C and 5D).

Then, as shown in FIG. 7D, solder pastes or conductive pastes 26-1 to -4 are applied to the surface on which the solder resist pattern is formed, and then chip parts 41a, 41b are mounted. The chip part 41b is mounted on the conductive paste 26-3 and only one terminal of the chip part 41b is electrically connected and another terminal is electrically connected to the conductive paste 26-4 after being folded.

Next, as shown in FIG. 7E, the portion corresponding to a region R1 is folded on a region R2 on which the chip parts 41a, 41b are mounted, and then the sheet is bent at the border between the region R2 and the region R3 so that the region R2 shown in FIG. 7D is stacked on the lower surface of the region R3. Thus, the chip parts are sandwiched between the wiring patterns of the region R1 and the region R2 to achieve electrical contact.

Figure 7F:
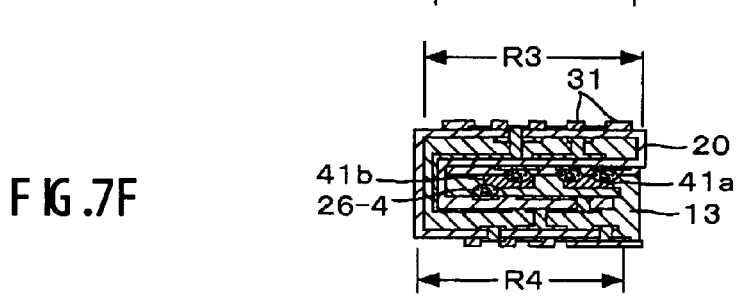

Then, as shown in FIG. 7F, the end portion corresponding to a region R4 is folded and stacked on the lowermost surface (region R1) shown in FIG. 7E.

Next, the wiring board of a folded structure is placed in a not shown jig, and heated and, for example, the surface of the region R3 is pressed while deaerating in a reduced pressure atmosphere to cure the resin in a state in which the wiring patterns 12 corresponding to the bumps are in close contact with one another, thus securing the interlayer conduction.

Then, if necessary, the resultant wiring board is trimmed into the ultimate external dimension, and a final properties test is conducted, thus completing a multilayer wiring board in the form of a circuit module having electronic parts integrally incorporated.

It is easily understood that the example shown in FIGS. 7A to 7F of the multilayer wiring board and the process for fabricating a multilayer wiring board exhibits effects similar to those achieved by the example shown in FIGS. 1A to 4C.

Particularly, in the multilayer wiring board on which an electronic part used as a high-frequency circuit is mounted, the electronic part is required to be electromagnetically shielded. The multilayer wiring board in the present example has a folded structure, which can easily form an electromagnetic shielding layer comprised of the wiring pattern surrounding the electronic part, enabling a stable operation without receiving an electromagnetic effect. No shielding case is needed, and hence the cost can be reduced, as compared to the cost for a conventional wiring board, and further the multilayer wiring board is not lowered in the device reliability due to vibration or the like.

Still another example of the best mode for carrying out the multilayer wiring board and the process for fabricating a multilayer wiring board of the present invention is described with reference to FIGS. 8A to 8G.

Figures 8A, 8B, 8C, 8D, 8E, 8F, 8G:
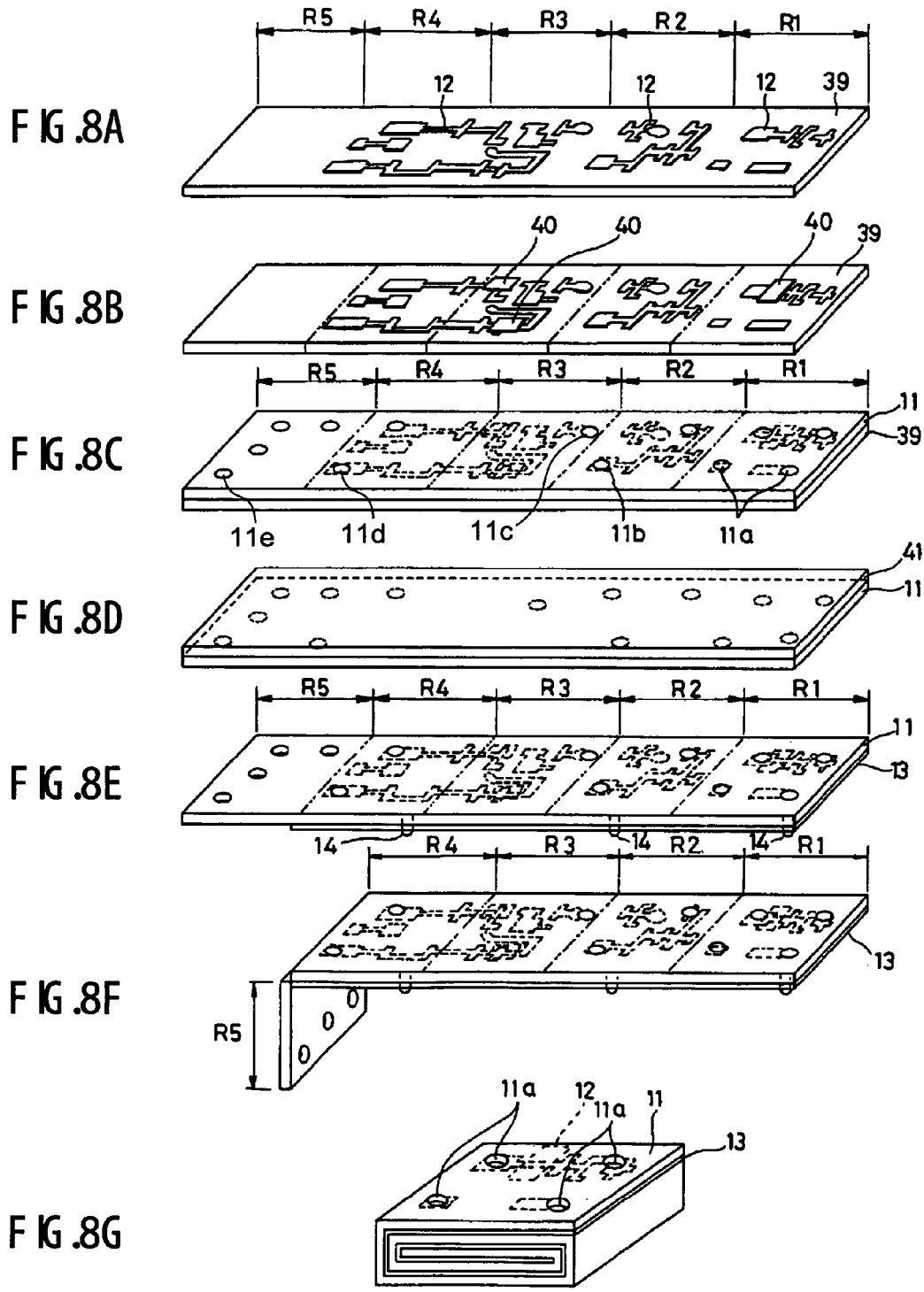
Figure 9:
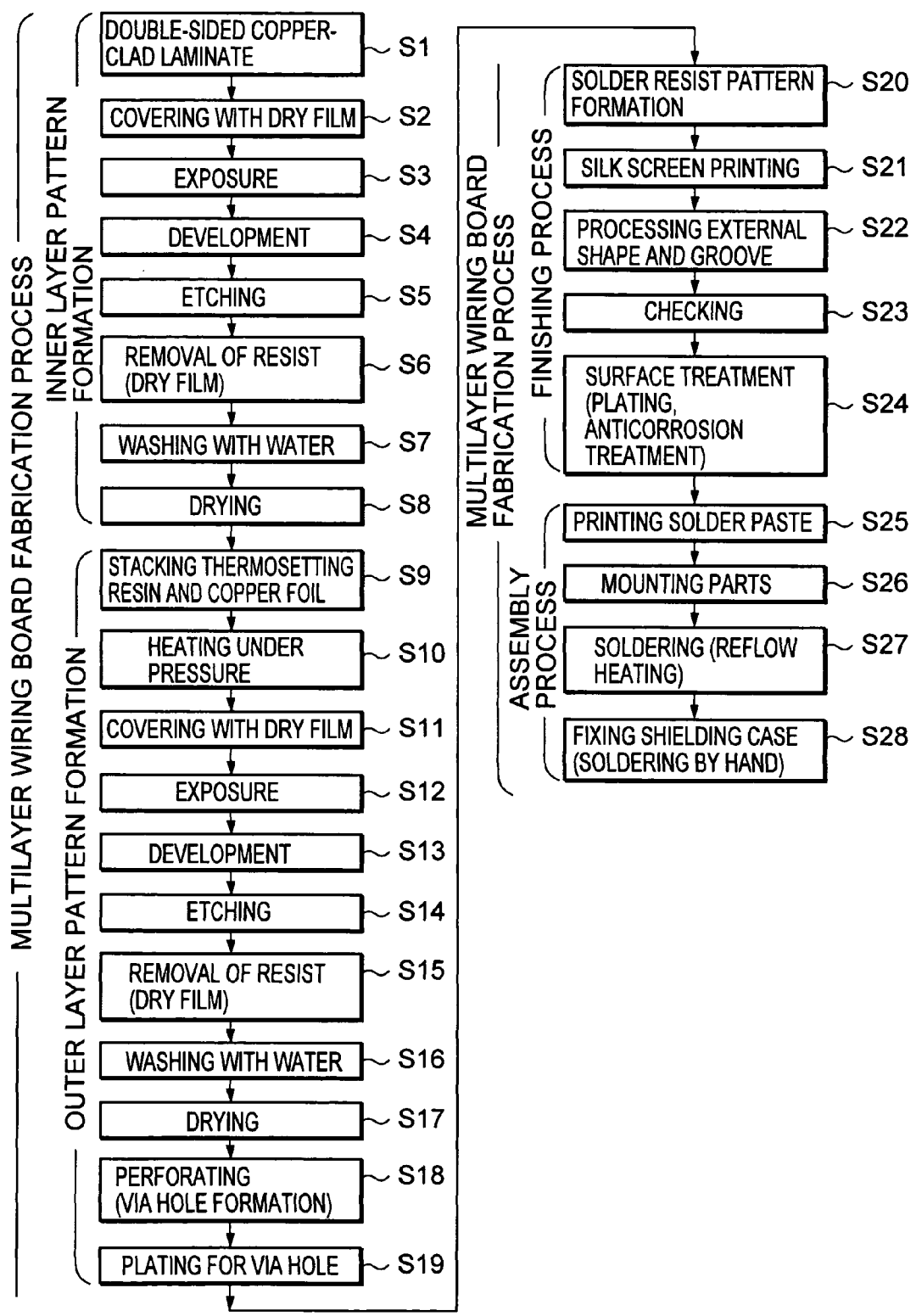
FIG. 9 is a flow diagram showing one example of flow of the fabrication of a conventional multilayer printed wiring board.

FIGS. 8A to 8G are cross-sectional views for explaining the fabrication procedure for the multilayer wiring board in the present example, wherein FIG. 8A shows the state in which wiring patterns are formed on a copper sheet, FIG. 8B shows the state in which a thick film device is formed, FIG. 8C shows the state in which a polyimide film having contact holes is formed, FIG. 8D shows the state in which the surface is covered with a masking film, FIG. 8E shows the state in which bumps are formed and an insulating bonding layer is formed, FIG. 8F shows the state in which the end portion is bent, and FIG. 8F shows the multilayer wiring board which is folded into a wound structure and cured.

In the example shown in FIGS. 7a to 7F, a chip part in a single form is embedded in the inner layer, whereas, in the multilayer wiring board and the process for fabricating a multilayer wiring board in the present example, a passive part, such as a resistor or a capacitor, is integrally formed in the wiring pattern.

In the following descriptions, in FIGS. 8A to 8G and FIGS. 1A to 4C, like parts or portions are indicated by like reference numerals.

First, as shown in FIG. 8A, a plating resist is applied to a copper sheet 39 having a thickness larger than 0.05 mm, and subjected to exposure using one photomask having formed therein wiring patterns 12 for all the layers (four layers in the present example), and developed. Then, the surface is plated with nickel at a thickness of about 5 μm, plated with gold at less than 1 μm, plated with nickel at about less than 5 μm, and plated with copper at about 20 μm. After plating with the copper, the plating resist is removed, transferring and forming the wiring patterns 12 comprised of layers of nickel-gold-nickel-copper on the copper sheet 39 as a support (hereinafter, the wiring pattern comprised of conductors having this layered construction is designated by reference numeral 12).

Then, as shown in FIG. 8B, a paste for resistor prepared by adding a high-resistant material, such as ruthenium oxide, to glass frit, which is glass piece obtained by mixing together natural raw materials, such as silica sand, feldspar, or lime, or industrial raw materials and melting the resultant mixture at a high temperature and quenching it, is printed on predetermined positions 40, 40, 40 of the wiring patterns 12, and calcined at about 900° to form a so-called thick film resistor. On the other hand, when a capacitor is formed, a paste for capacitor containing a dielectric material, such as barium titanate, is printed so as to cover an electrode region having a predetermined area of the wiring patterns 12, and then calcined at about 900°, and, for forming another electrode, an electrode pattern comprised of a conductive paste is formed on the dielectric material in the calcined paste. The calcination temperature is not limited to about 900°, but is adjusted in an appropriate range of temperature depending on the materials selected and the composition.

Next, as shown in FIG. 8C, photosensitive polyimide is applied so as to cover the entire surface of the wiring patterns 12 and dried, and then subjected to exposure using a photomask for forming contact holes 11a, 11b, 11c, 11d and through hole 11e, and developed to form the contact holes 11a, 11a, . . . in a predetermined arrangement, and subjected to thermal curing to form an insulating layer comprised of polyimide which has no photosensitivity and which is thermally stable (hereinafter, the polyimide film in this state is referred to as "polyimide sheet 11").

In this instance, as shown in FIG. 8C, in regions R1 to R5 assumed by dividing the polyimide sheet 11 into five regions, four contact holes 11a are assigned to the region R1, two contact holes 11b to the region R2, two contact holes 11c to the region R3, two contact holes 11d to the region R4, and four holes 11e to the region R5. By virtue of the formed contact holes 11a, 11b, 11c, 11d, 11e, as shown in FIG. 8C, part of the wiring patterns 12 and the surface of the copper sheet 39 are exposed through the contact holes 11a.

Then, the entire surface of the polyimide sheet 11 is covered with a masking film 41 having a resistance to etching, and the copper sheet 39 as a support is removed by etching in such a state that the contact holes 11a, 11b, 11c, 11d are covered. In this instance, the layers down to the gold-plated layer are etched, and, as shown in FIG. 8D, the polyimide sheet 11 is disposed under the masking film 41 and the wiring patterns 12 are embedded in the lower surface of the polyimide sheet 11. The masking film 41 is comprised of an opaque film having appropriate stiffness uniformly coated with an adhesive which lowers in bonding force due to curing by irradiation to an ultraviolet light or an adhesive having thermally foamability which lowers in bonding force due to heating.

Next, bumps (protrusions) 14 are formed from a conductive paste or the like on the portions of the wiring patterns 12 embedded in the lower surface of the polyimide sheet 11, and then an insulating bonding layer 13 is formed so as to cover the regions R2 through R5 on the lower surface of the polyimide sheet 11 in such a thickness that the bumps 14 are not completely buried in the bonding layer but the top portions of the bumps 14 protrude from the surface, and cured until it has no tackiness, followed by removal of the masking film 41 as shown in FIG. 8E. Then, unnecessary edge faces are removed before folding.

Then, as shown in FIG. 8F, a portion corresponding to the region R5 in which the through holes 11e are formed is bent so that the back surface is in contact with the surface, on which the wiring patterns 12 are formed, corresponding to the region R4, and, subsequently, the border between the region R4 and the region R3, the border between the region R3 and the region R2, and the border between the region R2 and the region R1 are successively bent in this order, thus forming a wound structure comprised of the polyimide sheet 11 as a base material shown in FIG. 8G (folding step).

Next, the wiring board of a wound structure is placed in a not shown jig, and heated and, for example, the surface of the region R1 is pressed while deaerating in a reduced pressure atmosphere to cure the resin in a state in which the layers are in close contact with one another, thus securing the interlayer conduction.

Finally, the resultant wiring board is trimmed into the external shape size and the unnecessary resin is removed to obtain individual pieces. Then, a final test is conducted and, if necessary, the lands which are the contact holes 11a, 11b formed in the upper and lower surfaces are subjected to gold plating or preflux treatment for corrosion prevention.

It is easily understood that the example shown in FIGS. 8A to 8G of the multilayer wiring board and the process for fabricating a multilayer wiring board exhibits effects similar to those achieved by the example shown in FIGS. 1A to 4C.

In the example shown in FIGS. 8A to 8G, a passive part, such as a resistor or a capacitor, can be easily incorporated.

The multilayer wiring board and the process for fabricating a multilayer wiring board of the present invention are not limited to the above examples, but they have various constructions such that the direction of folding the board is changed or the materials or steps are changed as long as the effect aimed at by the present invention is obtained.

The present invention contains subject mater related to Japanese Patent Application JP2004-253593 filed in the Japanese Patent Office on Aug. 31, 2004, the entire contents of which being incorporated herein by reference.

What is claimed is:

1. A method for fabricating a multilayer wiring board having wiring layers, the method comprising the steps of:

forming wiring patterns for the wiring layers and holes for a conductor surface of the wiring patterns on one insulating sheet, the insulating sheet having regions, one wiring pattern being arranged in each of the regions except one region, and at least one hole being arranged in each of the regions;

folding, in a predetermined order, the regions of the insulating sheet to stack one folded region of the insulating sheet on top of another region of the insulating sheet, the folding beginning with the region having at least one hole and not having the wiring pattern; and heating the folded and stacked insulating sheet in a vacuum under a pressure to form a three-dimensional electric wiring through the at least one hole.

2. The method according to claim 1, wherein the conductor surface of the wiring patterns is exposed through each of the holes to form protrusions, wherein an insulating bonding layer is formed so that the top portion of each protrusion is not completely buried in the bonding layer, and wherein each protrusion is electrically connected to another protrusion after folding and stacking the insulating sheet.

3. The method according to claim 1, wherein substantially an entire outermost surface of the insulating sheet is covered with a cured insulating resin.

4. The method according to claim 1, wherein an electronic part is formed on the wiring patterns, and wherein the electronic part is positioned at an inner wiring layer after folding and stacking the insulating sheet.

5. The method according to claim 4, wherein the electronic part is a resistor or a capacitor formed by calcination of a desired paste.

6. The method according to claim 4, wherein the insulating sheet is folded so that an electromagnetic shielding layer including the wiring pattern is arranged outside the electronic part.

* * * * *